(12) United States Patent
Takeshima et al.

(10) Patent No.: US 6,498,488 B2
(45) Date of Patent: Dec. 24, 2002

(54) MAGNETIC RESONANCE IMAGING APPARATUS

(75) Inventors: Hirotaka Takeshima, Ryugasaki (JP); Yoshihide Wadayama, Hitachiohta (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 09/992,356

(22) Filed: Nov. 13, 2001

(65) Prior Publication Data

US 2002/0060569 A1 May 23, 2002

(30) Foreign Application Priority Data

Nov. 20, 2000 (JP) ........................................ 2000-352019

(51) Int. Cl.⁷ ................................................. G01V 3/00
(52) U.S. Cl. ......................... 324/318; 324/309; 324/322
(58) Field of Search ................................ 324/318, 322, 324/306, 307, 309, 312

(56) References Cited

U.S. PATENT DOCUMENTS

| | | | |
|---|---|---|---|
| 4,682,111 A | * 7/1987 | Hughes | 324/320 |
| 4,978,920 A | * 12/1990 | Mansfield et al. | 324/318 |
| 5,061,897 A | 10/1991 | Danby et al. | |
| 5,555,251 A | * 9/1996 | Kinanen | 324/319 |
| 5,672,879 A | * 9/1997 | Glavish | 250/395 |
| 5,675,256 A | * 10/1997 | Young | 324/320 |
| 6,377,048 B1 | * 4/2002 | Golan et al. | 324/318 |

FOREIGN PATENT DOCUMENTS

| | | |
|---|---|---|
| JP | 6486954 | 3/1989 |
| JP | 9117431 | 5/1997 |

* cited by examiner

*Primary Examiner*—Edward Lefkowitz
*Assistant Examiner*—Brij B. Shrivastav
(74) *Attorney, Agent, or Firm*—Cooper & Dunham LLP

(57) ABSTRACT

A magnetic resonance imaging apparatus is provided with a pair of static magnetic field uniformity controlling members 30A and 30B which are disposed adjacent to respective pair of magnetic plates 25A and 25B and of which cross sections configured so as to further enhance static magnetic field uniformity in static magnetic field region 21 and a pair of flat plate shaped eddy current suppressing members 29A and 29B which are disposed adjacent to respective pair of gradient magnetic field coils 28A and 28B and shield influences of gradient magnetic field generated by the gradient magnetic field coils 28A and 28B on the static magnetic field uniformity controlling members 30A and 30B of pole pieces. The eddy current suppressing members 29A and 29B are easily manufactured from a flat plate member simply by cutting the same while following the shape of the gradient magnetic field coils 28A and 28B. Further, with the provision of the eddy current suppressing members 29A and 29B influences due to eddy current and residual magnetism induced by the gradient magnetic field coils 28A and 28B on the static magnetic field uniformity controlling members 30A and 30B are suppressed and uniformity in the uniform static magnetic field region is enhanced.

9 Claims, 6 Drawing Sheets

MAGNETIC RESONANCE IMAGING APPARATUS

BACKGROUND OF THE INVENTION

1. Field of the Invention

The present invention relates to a magnetic resonance imaging apparatus (hereinbelow will be called as MRI apparatus) which reconstructs images of tissue of a living inspection body and, in particular, relates to a magnet device of the MRI apparatus which is provided with an improved magnetic field correcting means, in that a pole piece, for enhancing static magnetic field uniformity in a magnetic field region where image photographing of the living inspection body is performed.

2. Conventional Art

In some of MRI apparatuses which reconstruct images of tissue of a living inspection body, the static magnetic field is generated by making use of superconducting coils. FIGS. 1A and 1B are diagrams showing an example of conventional MRI apparatus in which superconducting coils are used. FIG. 1A is a schematic outlook of the MRI apparatus, and FIG. 1B is a cross sectional view of FIG. 1A seen from arrow A in FIG. 1A. In this MRI apparatus, static magnetic field is generated by means of a pair of superconducting coils 13A and 13B which are opposingly disposed invertical direction. The superconducting coils 13A and 13B are supported by magnetic plates 15A and 15B disposed opposingly in vertical direction. The magnetic plates 15A and 15B are mechanically supported by post shaped yokes 16A through 16D disposed therebetween. Inside the superconducting coils 13A and 13B, pole pieces 14A and 14B made of iron and for providing a desirable static magnetic field uniformity are provided, and are supported by the magnetic plates 15A and 15B together with the superconducting coils 13A and 13B. The pole pieces 14A and 14B operate to enhance the static magnetic field uniformity in a uniform static magnetic field region 11. The magnetic plates 15A and 15B and the post shaped yokes 16A through 16D serve as magnetic passages for magnetic fluxes generated by the superconducting coils 13A.

In the thus constituted MRI apparatus, a magnetic circuit is formed which is constituted by the superconducting coils 13B, the pole piece 14B, the uniform static magnetic field region 11, the pole piece 14A, the superconducting coil 13A, the magnetic plate 15A, the post shaped yokes 16A through 16D and the magnetic plate 15B, thereby, uniform static magnetic field in vertical direction is generated in the uniform static magnetic field region 11. Photographing of magnetic resonance images is performed in this uniform static magnetic field region 11. Gradient magnetic field coils 18A and 18B used in the magnetic circuit are configured in generally flat plate shapes as shown in FIG. 1B and are opposingly disposed in vertical direction while interposing the uniform static magnetic field region 11 therebetween. The gradient magnetic field coils 18A and 18B are respectively received within the recessed portions of the pole pieces 14A and 14B.

It is well known that through activation of the gradient magnetic field coils 18A and 18B, eddy current is induced on conducting portions such as the pole pieces 14A and 14B and the superconducting coils 13A and 13B, and residual magnetism is also induced on ferromagnetic bodies such as the pole pieces 14A and 14B due to their hysteresis, all of which greatly affect adversely on the images to be reconstructed. In order to prevent generation of such eddy current and residual magnetism, it has been conventionally known to dispose eddy current suppressing members 19A and 19B such as a high magnetic permeability material having eddy current limiting property on the inner face of the recessed portions of the pole pieces 14A and 14B. For example, U.S. Pat. No. 5,061,897 discloses a provision of eddy current limiting member of high magnetic permeability material on the inner surface of the recessed portions of pole pieces. Further, JP-A-9-117431 (1997) discloses a provision of a plurality of blocks formed by laminating and integrating silicon steel sheets on the inner surface of the recessed portions of the pole pieces. Still further, JP-A-1-86954 (1989) discloses to constitute the inner surface of the recessed portions of the pole pieces by a magnetic material having high magnetic permeability and a compound magnetic material in such a manner that the magnetic material having high magnetic permeability locates next to the space of the static magnetic field region.

Although, all of the above conventional art discloses the provision of a low eddy current material or a high magnetic permeability material on the inner surface of the recessed portions of the pole pieces, none of the conventional art suggests working of the inner surface of the recessed portion of the pole pieces, in order to regulate static magnetic field uniformity in the uniform static magnetic field region. This is because mechanical working of such as the high permeability material having eddy current limiting property provided on the inner surface of the recessed portions of the pole pieces is generally difficult which prevents high precision working, and if working is possible which requires high cost. For this reason, with the conventional art it was difficult to sufficiently enhance the uniformity of the static magnetic field.

SUMMARY OF THE INVENTION

An object of the present invention is to provide an MRI apparatus having a magnet device with a pole piece which enhances uniformity of the static magnetic field region thereof as well as suppresses adverse effect by eddy current and residual magnetism induced on the pole piece by the gradient magnetic field coils.

An MRI apparatus of the present invention is provided with a pair of static magnetic field generating means which are disposed in opposing manner and cause to generate static magnetic field in the space region therebetween; a pair of static magnetic field correction means which enhance uniformity of the static magnetic field in the static magnetic field region; a pair of gradient magnetic field generating means which cause to generate gradient magnetic field in the static magnetic field region; and a pair of magnetic plate means which hold the static magnetic field generating means, the static magnetic field correction means and the gradient magnetic field generating means, wherein the static magnetic field corrections means is provided with a pair of static magnetic field uniformity controlling means of which cross sectional shapes are configured so as to enhance the uniformity of static magnetic field in the static magnetic field region and which are disposed adjacent to the respective magnetic plate means and a pair of flat plate shaped suppressing means which shield adverse effect of the gradient magnetic field generated by the gradient magnetic field generating means on the static magnetic field uniformity controlling means and which are disposed adjacent to the gradient magnetic field generating means. Wherein the static magnetic field uniformity controlling means is, for example, constituted by iron which is easily worked into a desired cross sectional shape which enhances uniformity of static magnetic field in the static magnetic field region, and the suppressing means, which is for preventing adverse effect on the static magnetic field uniformity controlling means of the pole pieces caused by the gradient magnetic field generated from the gradient magnetic field generating means, is worked and manufactured easily only by cutting out a flat plate of high magnetic permeability material having eddy current limiting property such as silicon steel sheet and soft ferrite into a simple disk while following the shape of the gradient magnetic field generating means.

In other words, in the present invention, a function of suppressing eddy current and residual magnetism induced on the static magnetic field uniformity controlling means by the gradient magnetic field from the gradient magnetic field coils added thereto is separated, and the portion functioning as suppressing the eddy current and residual magnetism which requires a low eddy current and high magnetic permeability material unsuited for precision working is constituted only by cutting out a flat plate of such material into a simple disk while following the shape of the adjacent gradient magnetic field generating means, and on the other hand, the portion of the original uniform static magnetic control function which requires a complex cross sectional shape is constituted by working an easily workable material, for example, soft iron, into a desired cross sectional shape with a high precision.

Further, the MRI apparatus of the present invention is further provided with a spacer means in a space between the static magnetic field uniformity controlling means and the suppressing means. Through the provision of the spacer means the suppressing means is fixed firmly and precisely.

Still further, the MRI apparatus of the present invention is further provided with a reinforcing means between the suppressing means and the spacer means for reinforcing the suppressing means. Since the suppressing means is constituted by adhering small pieces of such as silicon steel sheets and soft ferrite in a plane configuration and in multi-layers, it is difficult to obtain a sufficient mechanical strength. Therefore, through the provision of the spacer means and the reinforcing means between the static magnetic field uniformity controlling means and the suppressing means, the mechanical strength of the suppressing means is sufficiently enhanced.

DETAILED DESCRIPTION OF THE PREFERRED EMBODIMENTS

Hereinbelow, preferred embodiments of MRI apparatuses according to present invention will be explained with reference to the drawings.

Figure 1A:
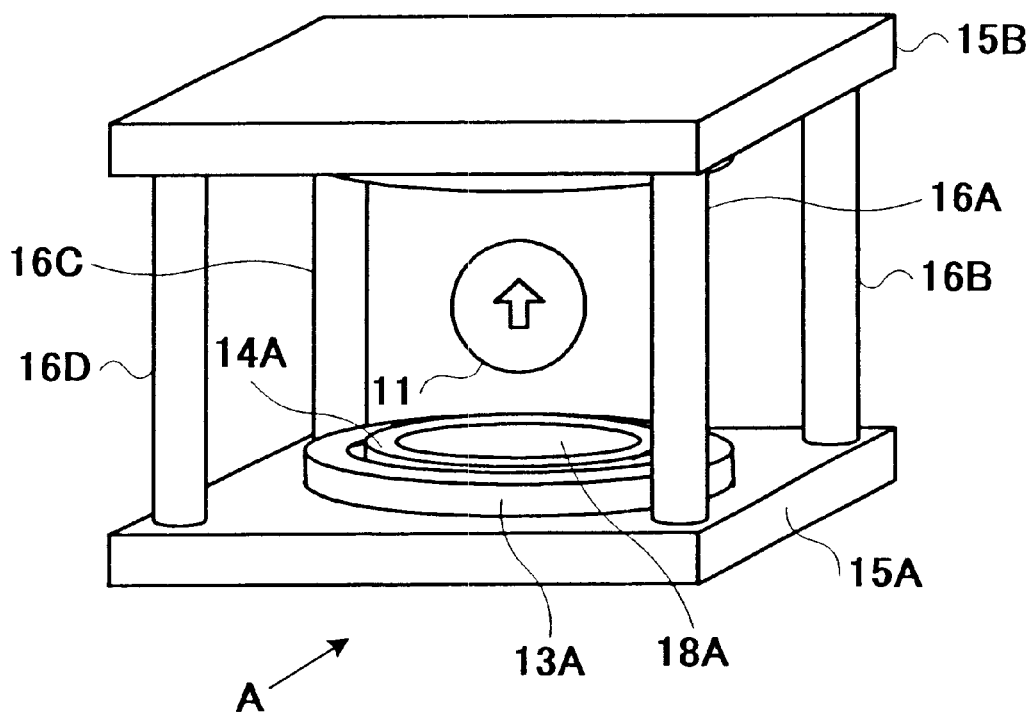
FIG. 1A is a diagram showing an example of conventional MRI apparatuses using superconducting coils.
Figure 1B:
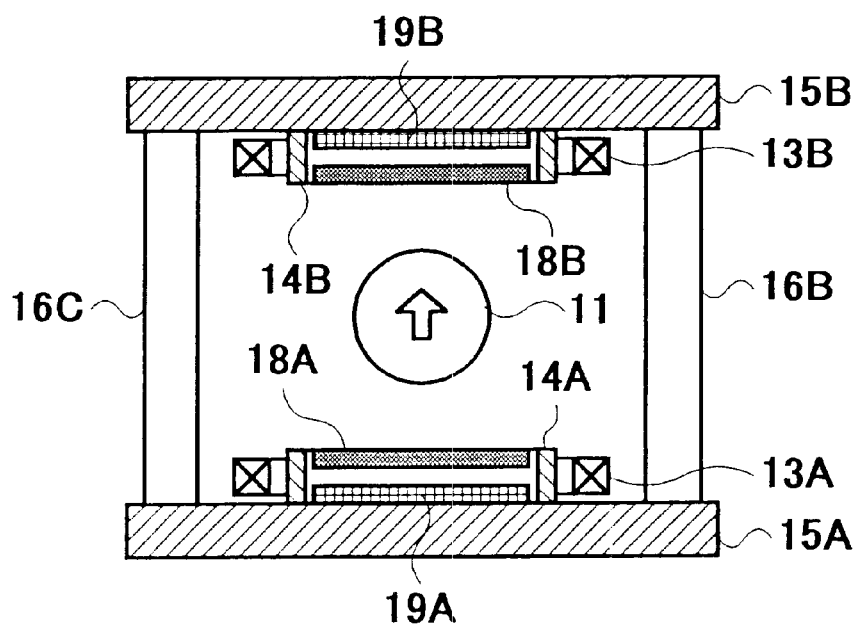
FIG. 1B is a cross sectional view of FIG. 1A seen from arrow A in FIG. 1A.
Figure 2:
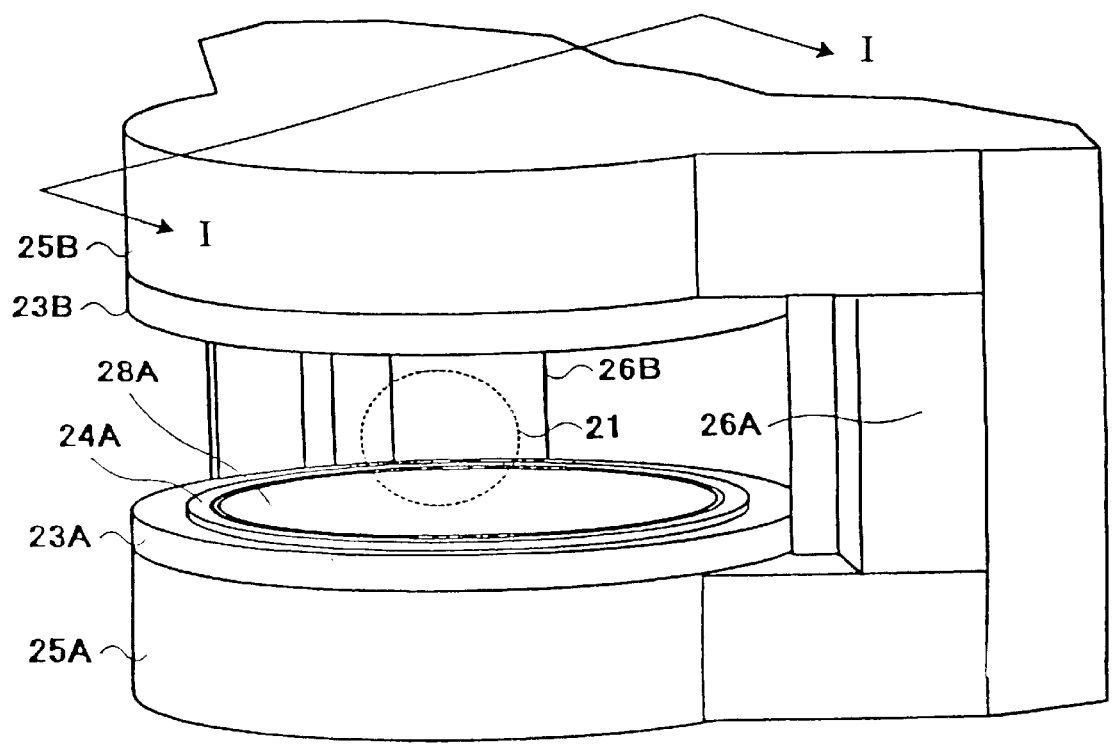
FIG. 2 is a schematic outlook of an MRI apparatus according to the present invention.
Figure 3:
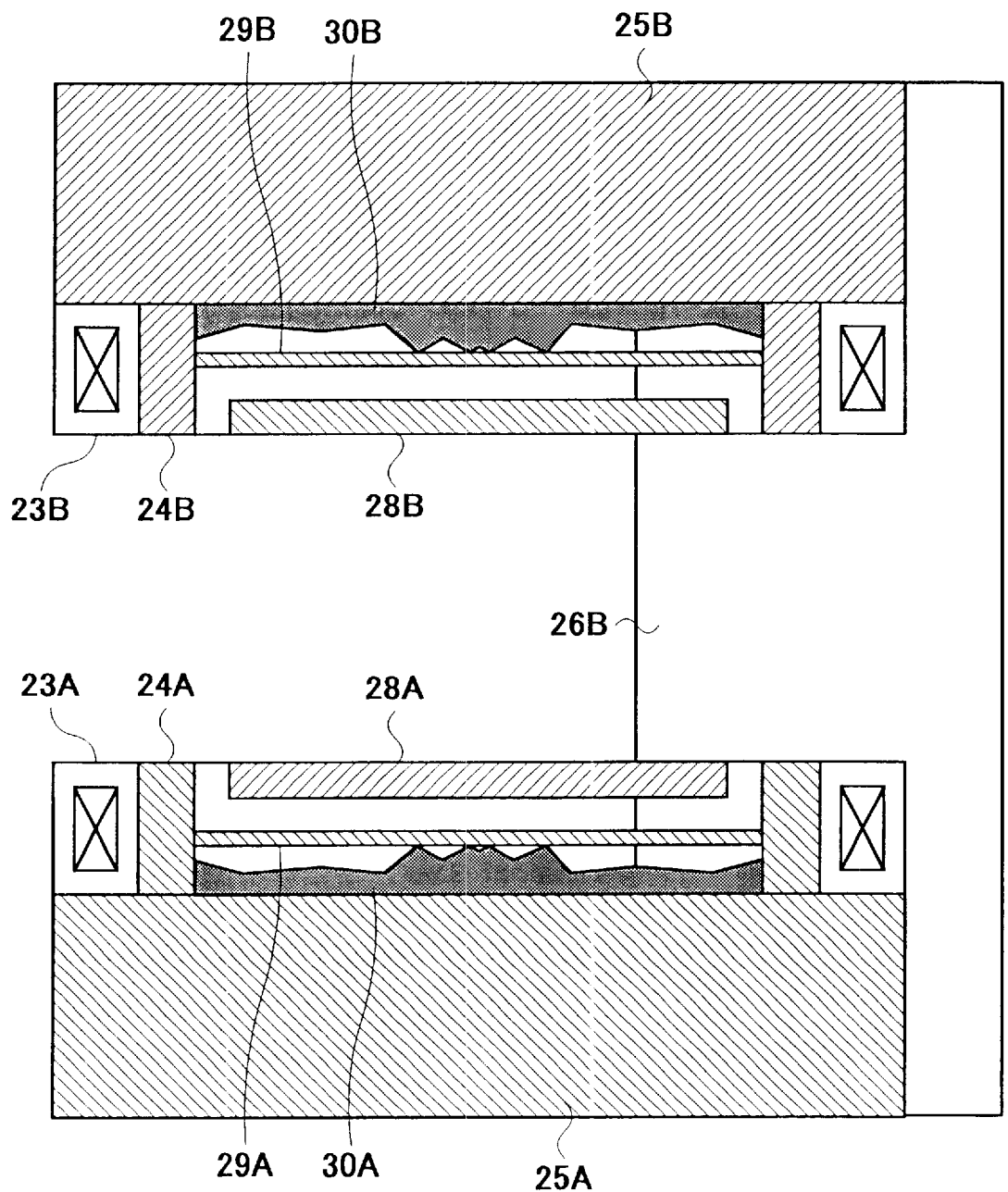
FIG. 3 is a cross sectional view of FIG. 2 taken along line I—I in FIG. 2.

FIG. 2 is a schematic outlook showing an MRI apparatus according to the present invention, FIG. 3 is a cross sectional view of FIG. 2 taken along line I—I in FIG. 2.

In the MRI apparatus, static magnetic field is generated by a pair of superconducting coils 23A and 23B disposed opposingly in vertical direction. The superconducting coils 23A and 23B are supported by a pair of magnetic plates 25A and 25B which are disposed opposingly in vertical direction. Further, although the superconducting coils 23A and 23B are actually provided within a cryostat, in the present specification the structure including the cryostat will be called as a superconducting coil. The magnetic plates 25A and 25B are mechanically supported by two post shaped yokes 26A and 26B so as to form space therebetween for a uniform static magnetic field region 21. Through the supporting structure by the two posts a person to be inspected can obtain open feeling. Inside the superconducting coils 23A and 23B ring shaped pole pieces 24A and 24B for obtaining a desired uniformity of static magnetic field and being constituted by iron are provided. Both the pole pieces 24A and 24B and the superconducting coils 23A and 23B are supported by the magnetic plates 25A and 25B.

The pole pieces 24A and 24B operate to enhance uniformity of static magnetic field in the uniform static magnetic field region 21, and inside the recessed portions thereof gradient magnetic field coils 28A and 28B, eddy current suppressing members 29A and 29B and static magnetic field uniformity control members 30A and 30B are accommodated. The gradient magnetic field coils 28A and 28B are generally flat plate shapes and are disposed opposingly in vertical direction while interposing the uniform static magnetic field region 21. As shown in FIGS. 2 and 3, the gradient magnetic field coils 28A and 28B are accommodated within the recessed portion of the pole pieces 24A and 24B and near at the top surface thereof. The eddy current suppressing members 29A and 29B are configured in a flat plate shape like the gradient magnetic field coils 28A and 28B, and are provided between the gradient magnetic field coils 28A and 28B and the magnetic plates 25A and 25B. The eddy current suppressing members 29A and 29B are constituted like the conventional ones by the material such as a high magnetic permeability material having eddy current limiting property and function so as to suppress generation of eddy current and residual magnetism on the pole pieces by the gradient magnetic coils 28A and 28B. Further, in the present specification although the term of eddy current suppressing member is used, however, the eddy current suppressing member also serves to suppress residual magnetism. Since the eddy current suppressing member 29A and 29B are constituted by a flat plate shaped member, the eddy current suppressing members 29A and 29B can be easily manufactured by working the same while following the simple shape of the gradient magnetic field coils 28A and 28B.

The static magnetic field uniformity controlling members 30A and 30B are for adjusting the uniformity of static magnetic field in the uniform static magnetic field region 21 and are constituted by an iron plate member provided with unevenness in its cross sectional configuration. In FIG. 3, a symmetric unevenness in cross section with respect to the center axis is provided for the static magnetic field uniformity control members 30A and 30B. In this instance, the magnetic field components distributed in symmetry with respect to the center axis can be corrected with the uneven configuration. When the configuration of unevenness is designed so as to meet the concerned magnetic field distribution of which uniformity is intended to be adjusted, a desirable uniformity of static magnetic field can be achieved. When determining a specific cross sectional configuration, it is necessary to take into account a non-linear magnetic field characteristic of a concerned ferromagnetic body, therefore, optimization is generally performed by making use of such assimulation with a computer. In the present embodiment, the configuration of uneven cross section of the static magnetic field uniformity controlling members 30A and 30B is determined to show a desirable uniformity of static magnetic field in the uniform static magnetic field region 21 under the pre-condition that the eddy current suppressing members 29A and 29B are provided within the pole pieces 24A and 24B. Further, since the static magnetic field uniformity controlling members 30A and 30B are made of iron, the static magnetic field uniformity controlling members 30A and 30B tend to be affected by eddy current and residual magnetism caused by the gradient magnetic coils 28A and 28B, therefore, if not combined with the eddy current suppressing members 29A and 29B, a large adverse effect will be caused on reconstructed images due to generation of eddy current and residual magnetism. Further, with the provision of the eddy current suppressing members 29A and 29B the effect of the static field uniformity controlling members 30A and 30B may be reduced, therefore, the eddy current suppressing members 29A and 29B are preferably disposed near to the side of the static magnetic field uniformity controlling members 30A and 30B or disposed so as to contact partly thereto. Still further, if the thickness of the eddy current suppressing members 29A and 29B is extremely thick, the effect of the static magnetic field uniformity controlling members 30A and 30B is reduced, therefore, it is preferable to determine the thickness of the eddy current suppressing members 29A and 29B in a range of a few mm to 50 mm.

In the thus constituted MRI apparatus, a magnetic circuit is formed, which is constituted by the superconducting coil 23B, the static magnetic field uniformity controlling member 30B, the pole piece 24A, the uniform static magnetic field region 21, the pole piece 24A, the static magnetic field uniformity controlling member 30A, the superconducting coil 23A, the magnetic plate 25A, the post shaped yokes 26A and 26B and the magnetic plate 25B, and generates uniform vertical static magnetic field controlled by the static magnetic field uniformity controlling members 30A and 30B in the uniform static magnetic field region 21 in which photographing of magnetic resonance images is performed.

Figure 4:
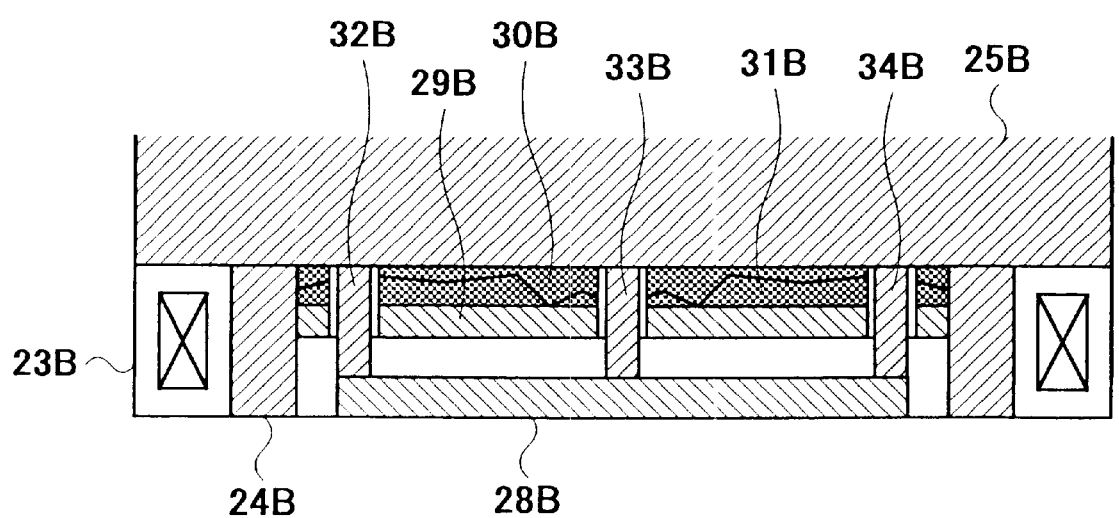
FIG. 4 is a partial detailed view of FIG. 3.

Since FIG. 3 shows a schematic location of the gradient magnetic field coil 28B, the eddy current suppressing member 29B and the static magnetic field controlling member 30B in the pole piece 24B, the details thereof will be explained with reference FIG. 4. As shown in FIG. 4, in order to firmly and precisely fix the eddy current suppressing member 29B a spacer 31 B of non-magnetic material is inserted between the static magnetic field uniformity controlling member 30B and the eddy current suppressing member coil 29B. The gradient magnetic field coil 28B is secured to supporting studs 32B, 33B and 34B which are secured to the magnetic plate 25B via through-holes provided respectively in the eddy current suppressing member 29B, the static magnetic field uniformity controlling member 30B and the spacer 31B. In the drawing only the studs 32B, 33B and 34B are illustrated, however, actually a plurality of studs are provided over the entire surface of the gradient magnetic field coil 28B and with these studs the gradient magnetic field coil 28B is firmly secured to the magnetic plate 25B. This is because since a large Lorentz force is generated due to interference between the current flowing through the gradient magnetic field coil 28B and the static magnetic field to cause vibration of the gradient magnetic field coil 28B, it is preferable, in order to prevent such vibration, to secure the gradient magnetic field coil 28B at the side of structurally solid magnetic plate 25B having large mass. Further, with regard to attaching positions of the studs it is preferable to provide the same near the outer circumference and the center portion of the gradient magnetic field coil 28B. Still further, in order to prevent such vibration and to support the weight of the gradient magnetic field coil 28B, if required the studs can be located at positions other than the above to thereby suppress the vibration effectively.

Further, when the thickness of the static magnetic field controlling member 30B is sufficiently thick, the studs can be secured to the static magnetic field controlling member 30B instead of the magnetic plate 25.

Figure 5:
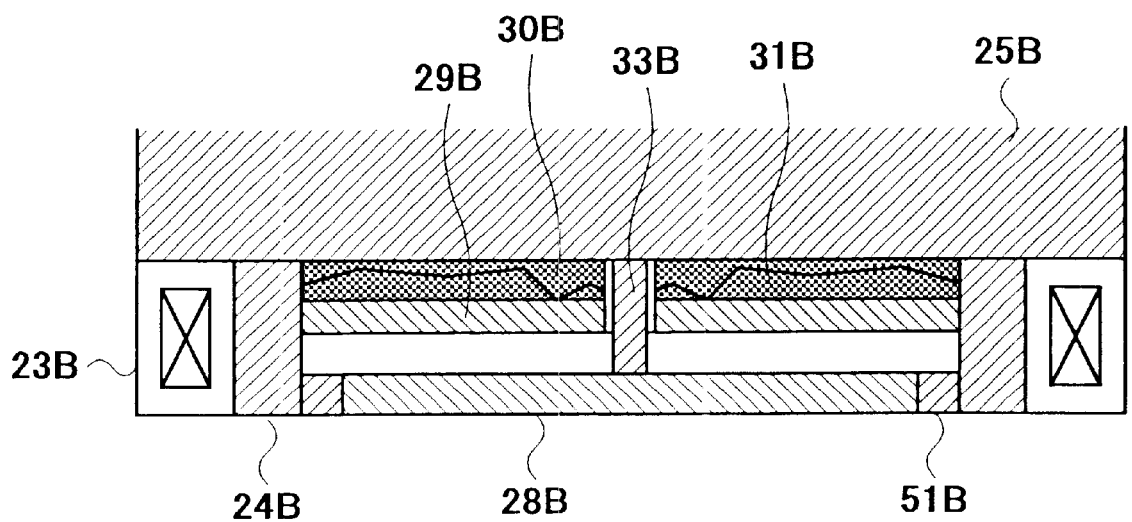
FIG. 5 is a diagram showing a modification of the embodiment as shown in FIG. 4.

Now, modifications of MRI apparatuses according to the present invention will be explained. FIG. 5 is a diagram showing a modification of FIG. 4 embodiment. A different point of FIG. 5 modification from FIG. 4 embodiment is that the outer circumference of the gradient magnetic field coil 28B is secured to the inner circumference of the outer circumferential ring in the pole piece 24B by making use of supporting members 51B. In this modification, since it is unnecessary to provide the through holes in the static magnetic field uniformity controlling member 30B, the spacer 31B and the eddy current suppressing member 29B except for ones at the center thereof, the manufacturing thereof is facilitated.

Figure 6:
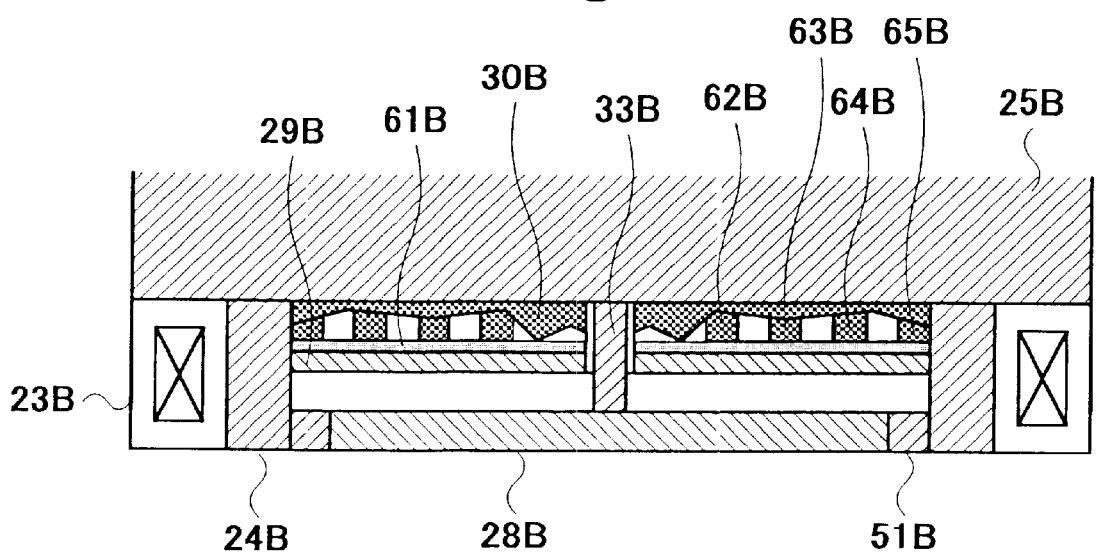
FIG. 6 is a diagram showing a modification of the modification as shown in FIG. 5.

FIG. 6 is a diagram showing a modification of FIG. 5 modification. A different point of FIG. 6 modification from FIG. 5 modification is that in place of the spacer 31B in FIG. 5 a spacer is constituted by a disk shaped reinforcing member 61B and ring shaped non-magnetic spacers 62B through 65B. Namely, in FIG. 5 modification the spacer 31B has to be manufactured so as to follow the surface configuration of the static magnetic field uniformity controlling member 30B, however, in FIG. 6 modification it is sufficient if the reinforcing member 61B is formed into a disk shape following the shape of the eddy current suppressing member 29B and the non-magnetic spacers 62B through 65B are formed into a ring shape or column shape which makes the working thereof easy. Further, the reinforcing member 61 B is constituted by a member having high rigidity which is closely contacted to the back side of the eddy current suppressing member 29B so as to structurally strengthen and reinforce the eddy current suppressing member 29B.

Although either magnetic material or non-magnetic material can be used for the reinforcing member, however, if a non-magnetic material is used therefor, possible eddy current is further reduced. On the other hand, if a magnetic material is used for the reinforcing member 61B, since a material having high rigidity can be selected, the thickness thereof for obtaining a necessary rigidity can be thinned.

Further, if the respective thickness of the gradient magnetic field coil 28B, the eddy current suppressing member 29B and the reinforcing member 61B are thickened, the respective performances thereof are generally enhanced, therefore, each requires a high share in the height direction inside the cylindrical space region surrounded by the outer circumferential ring of the pole piece. Accordingly, if the reinforcing member 61B can be thinned, the thickness in the height direction of the other members can be increased and the performance thereof can be enhanced.

Still further, the eddy current suppressing member 29B is constituted by adhering small pieces of such as conventionally used silicon steel sheets and soft ferrite in substantially plane shape, therefore, it is difficult for the eddy current suppressing member 29B to obtain a sufficient mechanical strength. Thus, with the provision of the reinforcing member 61 B and the spacers 62B through 65B as shown in FIG. 6, the mechanical strength of the eddy current suppressing member 29B can be sufficiently increased.

In the above embodiment and modifications thereof the use of the superconductive magnet is exemplified, however, the present invention can also be applied to an MRI apparatus using a permanent magnet.

As has been explained hitherto, according to the MRI apparatus of the present invention, the adverse effect of eddy current and residual magnetism induced on the pole pieces by the gradient magnetic coils is suppressed as well as the static magnetic field uniformity in the uniform static magnetic field region is enhanced.

What is claimed is:

1. A magnetic resonance imaging apparatus comprising a pair of static magnetic field generating means which are disposed in opposing manner and generate a static magnetic field in a space region therebetween; a pair of static magnetic field correction means which enhance uniformity of the static magnetic field in the static magnetic field region; a pair of gradient magnetic field generating means which generate gradient magnetic field in the static magnetic field region; and a pair of magnetic plate means which hold the static magnetic field generating means, the static magnetic field correction means and the gradient magnetic field generating means, wherein the static magnetic field corrections means includes static magnetic field uniformity controlling means comprising a ferromagnetic body which is disposed adjacent to the magnetic plate means and has a cross section configured in a predetermined shape for enhancing static magnetic field uniformity in the static magnetic field region; a flat plate shaped ferromagnetic suppressing means which is separately formed from the static magnetic field controlling means, is disposed adjacent to the gradient magnetic field generating means, and shields the static magnetic field controlling means from influences of gradient magnetic field generated by the gradient magnetic field generating means; and a ferromagnetic ring which surrounds the static magnetic field uniformity controlling means and the ferromagnetic suppressing means.

2. A magnetic resonance imaging apparatus according to claim 1, wherein the static magnetic field uniformity controlling means comprising a ferromagnetic body comprises an easily workable material and the ferromagnetic suppressing means comprises a material that has low eddy current and high magnetic permeability properties and is less easily workable than the material of the static magnetic field uniformity controlling means.

3. A magnetic resonance imaging apparatus according to claim 1, wherein the static magnetic field uniformity controlling means comprising a ferromagnetic body is made of soft iron and the ferromagnetic suppressing means is made of a material selected from silicon steel sheets and soft ferrite.

4. A magnetic resonance imaging apparatus according to claim 1, wherein a spacer means is further provided in a space between the static magnetic field uniformity controlling means and the ferromagnetic suppressing means.

5. A magnetic resonance imaging apparatus according to claim 4, wherein a reinforcing means for reinforcing the mechanical strength of the ferromagnetic suppressing means is further provided between the ferromagnetic suppressing means and the spacer means.

6. A magnetic resonance imaging apparatus according to claim 5, wherein the spacer means is made of a plurality of non-magnetic rings arranged concentrically.

7. A magnetic resonance imaging apparatus according to claim 5, wherein the spacer means is made of a plurality of non-magnetic columns arranged on a plurality of concentric imaginary circles.

8. A magnetic resonance imaging apparatus according to claim 1, wherein the gradient magnetic field generating means is supported by at least one of the magnetic plate means and the static magnetic field uniformity controlling means with a plurality of supporting studs which pass through a plurality of through-holes formed in the ferromagnetic suppressing means.

9. A magnetic resonance imaging apparatus according to claim 1, wherein the gradient magnetic field generating means is supported by at least one of the magnetic plate means and the static magnetic field uniformity controlling means with at least one supporting stud which passes through a through-hole formed in the ferromagnetic suppressing means, and by the ferromagnetic ring with a plurality of supporting members disposed between the ferromagnetic ring and the outer circumference of the gradient magnetic field generating means.

* * * * *